United States Patent [19]

Reynolds et al.

[11] Patent Number: 5,500,392
[45] Date of Patent: Mar. 19, 1996

[54] PLANAR PROCESS USING COMMON ALIGNMENT MARKS FOR WELL IMPLANTS

[75] Inventors: James Reynolds, Dallas; Michael C. Smayling, Missouri City, both of Tex.

[73] Assignee: Texas Instruments Incorporated, Dallas, Tex.

[21] Appl. No.: 259,268

[22] Filed: Jun. 13, 1994

Related U.S. Application Data

[63] Continuation of Ser. No. 114,431, Aug. 31, 1993, abandoned, which is a continuation of Ser. No. 857,533, Mar. 25, 1992, abandoned.

[51] Int. Cl.$^6$ .................................................. H01L 21/22
[52] U.S. Cl. ............................ 437/151; 437/34; 437/924
[58] Field of Search ............................ 437/34, 151, 229, 437/152, 924; 148/DIG. 102

[56] References Cited

U.S. PATENT DOCUMENTS

| | | | |
|---|---|---|---|
| 3,697,318 | 10/1972 | Feinberg et al. | 148/DIG. 102 |
| 4,936,930 | 6/1990 | Gruber et al. | 437/924 |
| 4,981,529 | 1/1991 | Tsujita | 437/924 |
| 5,002,902 | 3/1991 | Watanabe | 437/924 |
| 5,047,358 | 9/1991 | Kosiak et al. | 437/34 |
| 5,059,546 | 10/1991 | Havemann | 437/34 |
| 5,075,242 | 12/1991 | Nakahara | 437/34 |
| 5,242,841 | 9/1993 | Smayling et al. | 437/151 |

FOREIGN PATENT DOCUMENTS

| | | | |
|---|---|---|---|
| 0230648 | 8/1987 | European Pat. Off. | 437/924 |
| 63-187628 | 8/1988 | Japan | 437/924 |

*Primary Examiner*—Chandra Chaudhari
*Attorney, Agent, or Firm*—Mark A. Valetti; W. James Brady, III; Richard Donaldson

[57] ABSTRACT

A preferred embodiment of the present invention is a method of forming a device on a semiconductor substrate of a first conductivity type, the method comprising: forming a semiconducting layer on the substrate; etching alignment marks in the semiconducting layer (102); forming a first mask on the semiconducting layer to expose portions of the semiconducting layer; introducing dopants of a second conductivity type opposite the first conductivity type into the exposed portions of the semiconducting layer to form high-voltage tanks (104); removing the first mask; annealing the dopants introduced to form high-voltage tanks of a second conductivity type (105); forming a second mask on the semiconducting layer to expose second portions of the semiconducting layer; introducing dopants of a second conductivity type into the exposed second portions of the semiconducting layer to form low-voltage tanks (106); removing the second mask; forming a third mask on the semiconducting layer to expose third portions of the semiconducting layer; introducing dopants of a first conductivity type into the exposed third portions of the semiconducting layer to form high-voltage tanks (107); removing the third mask; forming a fourth mask on the semiconducting layer to expose fourth portions of the semiconducting layer; introducing dopants of a first conductivity type into the exposed fourth portions of the semiconducting layer to form low-voltage tanks (108); and annealing dopants introduced to form high-voltage and low-voltage tanks of the first and second conductivity types.

4 Claims, 3 Drawing Sheets

PLANAR PROCESS USING COMMON ALIGNMENT MARKS FOR WELL IMPLANTS

This application is a Continuation, of application Ser. No. 08/114,431 filed Aug. 31, 1993, now abandoned (which is a continuation of 07/857,533 filed on Mar. 25, 1992, now abandoned).

CROSS-REFERENCE TO RELATED APPLICATIONS

The following coassigned patent applications are hereby incorporated herein by reference:

| Ser. No. | Filing Date | TI Case No. |
| --- | --- | --- |
| 07/857,360 | 03/25/92 | 16230 |
| | now U.S. Pat. No. 5,242,841. | |

FIELD OF THE INVENTION

This invention relates to the fabrication of semiconductor integrated circuit devices and in particular to the use of global marking(s) to align elements of the device(s).

BACKGROUND OF THE INVENTION

Heretofore, conventional processing of CMOS, BiCMOS, and other MOS devices had many complex steps. Many of these complex steps are related to the selective implantation of n and p type tanks. One example of such a process flow is shown in FIG. 1.

An oxide layer is grown over a semiconductor substrate. A nitride layer is deposited, patterned, and etched to form a pattern for the n-tanks. After the implantation of the n-type dopant, oxide is grown in the regions devoid of nitride. Once the oxide is grown, the nitride is removed and the p-type regions are formed. Because the oxide is thicker over the regions doped by n-type dopant, the p-type dopants do not penetrate the oxide and diffuse into the n-tanks. Next, the oxide is removed.

The process of FIG. 1 creates an undesirable step in the n-tank as illustrated in FIG. 2. Because a thicker oxide was grown over the n-tanks and growing oxide over silicon consumes a portion of the silicon to form silicon dioxide, a significant step is formed. The step in the silicon in the n-tank causes serious performance degradations and makes processing more difficult.

The prior art saves a masking step, p-tank, by using a self-aligned process as described above. However, for a complex process with multiple tanks, such as low-voltage and high-voltage tanks, there is no savings in the number of mask steps and, in fact, an additional plasma etch may be required.

It is an object of this invention to eliminate some of the process steps for defining the n and p-tanks. In conjunction with the desire to eliminate process steps, it is also desirable to keep the device as planar as possible. Another object of this invention is to eliminate the step in silicon in the n-tank regions.

Other objects of the present invention are to mask and implant tanks of different concentration or conductivity type without having to anneal after each implantation step; and perform a majority of the high-temperature process steps early in the process flow. Further objects and advantages of the invention will become apparent to those of ordinary skill in the art having reference to the following specification together with the drawings.

SUMMARY OF THE INVENTION

The invention relates to forming global alignment marks in a semiconductor layer or the substrate. By etching patterns, preferably "L" shapes or "+" shapes, into the semiconducting layer or substrate, the alignment marks are formed. Later semiconductor processing steps, such as the formation of tank and moat regions, are aligned to these global marks. This eliminates previously required oxide masks and undesirable steps in the semiconducting layer in the regions of the later formed tanks.

A first embodiment of the present invention is a method of forming a device on a semiconductor substrate, the method comprising: forming an insulating layer on the substrate; patterning and etching alignment marks into the insulating layer and the substrate; selectively forming a region of a first conductivity type in the substrate by aligning to the alignment marks; and selectively forming regions in the substrate of a second conductivity type opposite the first conductivity type by aligning to the alignment marks.

Another embodiment of the present invention is a method of forming a device or multiple devices on a planar semiconductor surface, said method comprising: forming a semiconducting layer, preferably formed of a second conductivity type, on a semiconductor substrate, preferably formed of a second conductivity type; forming an insulating layer on the semiconducting layer; patterning and etching alignment marks into the insulating layer and the semiconducting layer; selectively forming regions of a first conductivity type in the semiconducting layer by aligning to the alignment marks; selectively forming regions of a second conductivity type opposite the first conductivity type in the semiconducting layer by aligning to the alignment marks; and performing a single anneal step to anneal the regions of a first conductivity type and the regions of a second conductivity type.

The device or multiple devices fabricated by the aforementioned process can include any or all of the following: LDMOS, VDMOS, EPROMs, EEPROMs, logic FETs, lateral NPN transistors, vertical NPN transistors, lateral PNP transistors, and vertical PNP transistors.

A third preferred embodiment of the present invention is a method of forming a device on a planar semiconductor substrate, the method comprising: forming alignment marks in the semiconductor substrate; forming a plurality of tanks in the substrate, wherein portions of the plurality of tanks are formed with different masks; annealing, preferably in a single anneal step, the plurality of tanks; and wherein the masks are aligned to the alignment marks.

A fourth preferred embodiment is a method of forming a device on a semiconductor substrate of a first conductivity type, the method comprising: forming a semiconducting layer on the substrate; etching alignment marks in the semiconducting layer; forming a first mask on the semiconducting layer to expose portions of the semiconducting layer; introducing dopants of a second conductivity type opposite the first conductivity type into the exposed portions of the semiconducting layer to form high-voltage tanks; removing the first mask; annealing the dopants introduced to form high-voltage tanks of a second conductivity type; forming a second mask on the semiconducting layer to expose second portions of the semiconducting layer; introducing dopants of a second conductivity type into the exposed second portions of the semiconducting layer to form low-voltage tanks; removing the second mask; forming a third mask on the semiconducting layer to expose third portions of the semiconducting layer; introducing dopants of a first conductivity type into the exposed third portions of the semiconducting layer to form high-voltage tanks; removing the third mask; forming a fourth mask on the semiconducting layer to expose fourth portions of the semiconducting layer; introducing dopants of a first conductivity type into the exposed fourth portions of the semiconducting layer to form low-voltage tanks; and annealing dopants introduced to form high-voltage and low-voltage tanks of the first and second conductivity types.

DETAILED DESCRIPTION OF PREFERRED EMBODIMENTS

Figure 1:
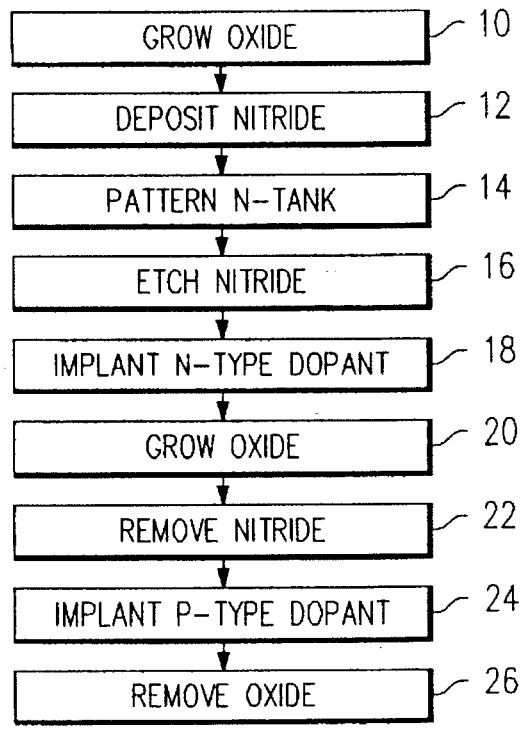
FIG. 1 is a flow chart of a semiconductor process flow known in the art.
Figure 2:
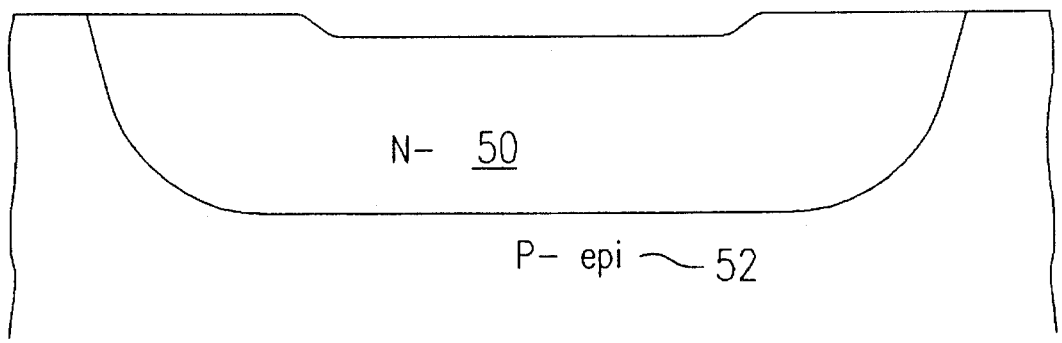
FIG. 2 is a cross-sectional view of a device fabricated by the process steps of FIG. 1.
Figure 3:
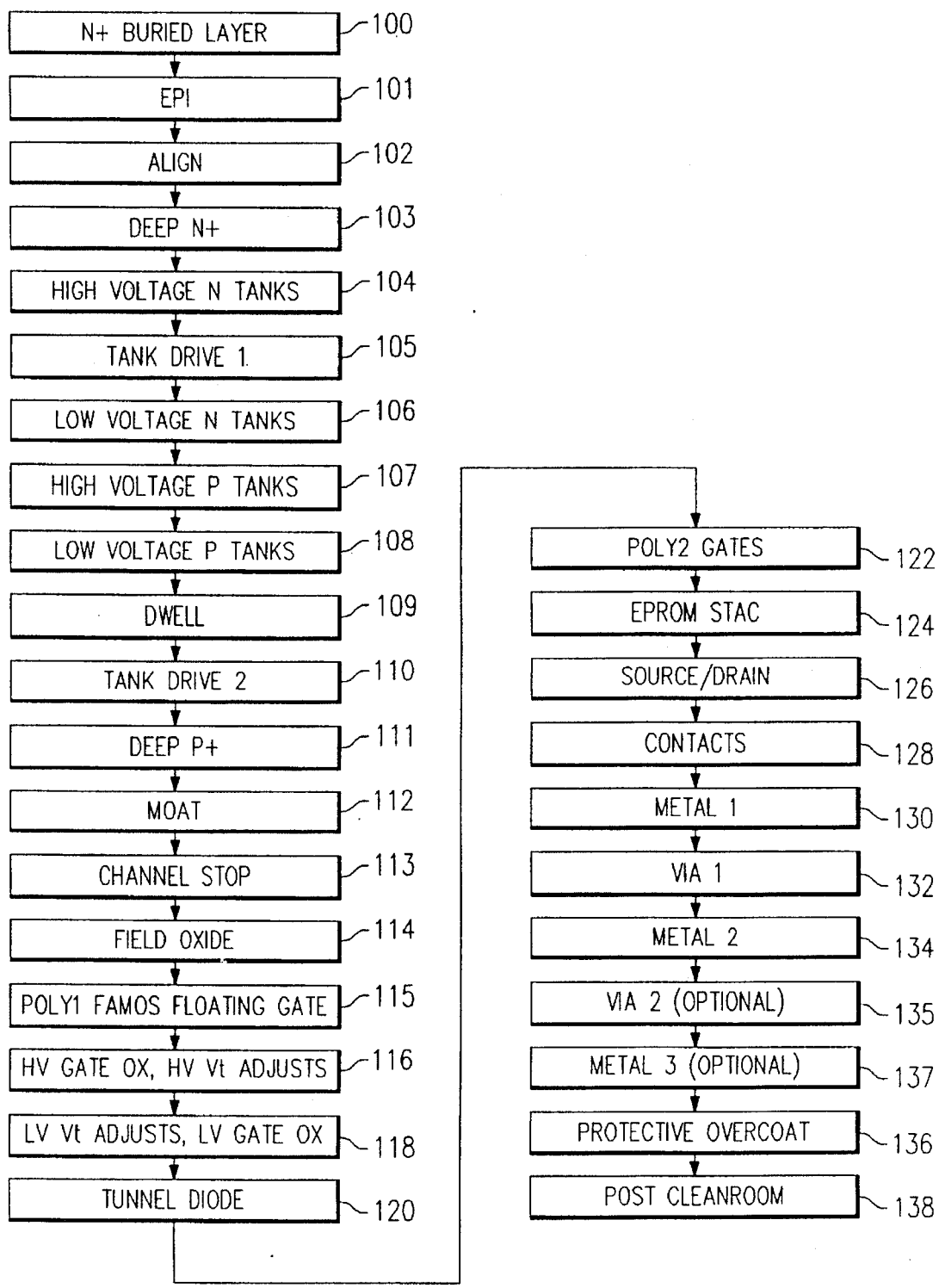
FIG. 3 illustrates a preferred embodiment of a process flow according to the present invention.

FIG. 3 is a flow chart of a preferred embodiment that provides process fabrication steps used in manufacturing a semiconductor chip having power devices, non-power devices, and/or memory devices all on the same semiconductor substrate.

While the process is described in conjunction with the fabrication of devices in a (p) type silicon substrate and epitaxial layers, the process has application to (n) type semiconductor materials and to other semiconductors.

Process step 100 is the selective creation of an (n+) buried layer formed in a p-type silicon layer. The (n+) buried layer is positioned between two (p−) epitaxial layers, the lower of which extends over a (p+) substrate and the upper of which is formed in EPI step 101. The (n+) buried layer is needed for vertical double diffused "metal" oxide semiconductor (VDMOS) n-channel power transistors. A buffed (n+) layer is also used as the collector for a vertical npn bipolar transistor. A laterally separate (n+) buried layer may be created for each VDMOS transistor, or one such layer may be used for several such transistors if these are intended to be connected in parallel.

The next process step is the advantageous creation of alignment marks on the semiconductor substrate. These alignment marks are used to locate and selectively create most of the tanks and the moat regions, preferably by aligning the photoresist masks to the alignment marks. The alignment marks are preferably spaced away from the devices and are used to align many regions for many different die on a wafer. Preferably, the alignment marks are etched, using the previously formed (n+) buried layer for alignment, into the substrate or layer of epitaxially grown silicon in step 102. The actual shape of the marks are not critical, but are preferably an "L" shape or a "+" shape.

At step 103, at least one respective deep (n+) implant is used in order to connect each (n+) buried layer to surface contacts for the vertical transistors. Step 104 fabricates (n−) transistor tanks for the high voltage power transistors. These tanks are large diffused regions in which the power transistors themselves are fabricated and are aligned using the alignment mark(s) formed in step 102. These tanks are preferably made by forming a photoresist mask, aligned to the global alignment marks, and blanketly implanting n-type dopant into the exposed portions of the epitaxially grown silicon.

After the formation of the (n−) tanks, a tank drive 105 is performed to diffuse the implanted regions. At step 106, low-voltage device (n−) tanks are created to enclose conventional low-voltage ($V_{dd} \leq 5$ volts) logic field effect transistors, as well as components of, for example, vertical and lateral DMOS n-channel power transistors, and drain-extended n-channel power transistors. Low-voltage n-tanks are also used to enclose Schottky diodes. The high- and low-voltage tanks described herein differ in the dopant concentrations that are used to create them, and are thus implanted into the chip at different times. The high voltage tanks have less of a dopant concentration in them to preserve a high pn junction diode breakdown, but are deeper. The low-voltage tanks are shallower, but have a higher concentration of dopant. Both the low-voltage tanks and the high-voltage tanks are aligned using the alignment mark(s).

At step 107, a plurality of high-voltage p-tanks are created in the epitaxial layer by implanting p-type dopant into regions of the epitaxial layer that are not covered by a photoresist mask (not shown). The high-voltage p-tanks are used as tanks for 18 volt EEPROM gating transistors, Fowler-Nordheim tunneling EEPROM cells in the EEPROM array itself, as channel regions for drain extended p-channel transistors, and as tanks for floating gate avalanche injection electrically programmable read-only memory (FAMOS EPROM) cells. Step 108 involves the fabrication of low-voltage p-tanks as, for example, enclosures for low-voltage n-channel field effect logic transistors, as drains for extended drain p-channel field effect transistors, and as channel regions for n-channel LDMOS and VDMOS transistors. Like the high-voltage p-tanks formed in step 107, the low-voltage p-tanks are formed by implanting p-type dopants into exposed portions of the epitaxial layer. The exposed portions of the epitaxial layer are defined by photoresist masks that are aligned to the global alignment marks.

Dwell step 109 is the next step of the process. The Dwell step 109 is used to create an n-type region within a p-type region. The n-type and p-type dopants are implanted into the same locations and in subsequent thermal process steps form a smaller n-type region within the larger p-type region. The difference in size is due to the different diffusion rates of the dopants. After the Dwell step 109, a second tank drive step 110 is performed. This step is used to diffuse all of the implanted regions.

The aforementioned is one advantage of the present invention. In conventional processing, each tank is aligned to a prior tank or to an oxide or a nitride mask. In order to correctly align the current tank, the previously formed tank must be annealed prior to the implantation of the current tank. These methods of fabrication require multiple anneal steps or multiple mask steps in order to align multiple tanks. The alignment marks of the present invention can be used to align photoresist masks, which are easily removed without altering the device, that are used to define the regions to be implanted. Thereby making it possible to mask/implant several regions before having to anneal.

At step 111, deep (p+) implantations are performed, for example, to form back gates for the lateral and vertical DMOS n-channel power transistors. At step 112, the moat or isolating oxide regions surrounding the active device areas are defined with a mask which is aligned to the alignment mark(s) formed in step 102. Channel stop implants that further isolate the devices from each other are carried out at step 113. In step 114, the previously defined isolating oxide regions are locally grown on the face of the semiconductor epitaxial layer to form field oxides.

Step 115 concerns the formation of a first-level polycrystalline silicon (poly 1) conductor for, for example, floating gate avalanche injection "metal" oxide semiconductor (FAMOS) EPROM cell, and/or double-level poly EEPROM cells. The mask used to define the polycrystalline silicon conductors is aligned to the field oxide formed in step 114.

Next, at step 116, the gate oxide for the control gates of the high-voltage and high power transistors is formed, and threshold voltage ($V_t$) adjust implants are performed for these transistors. At stop 118, similar low-voltage $V_t$ adjust implants are performed through the high-voltage gate oxide layer. For the low voltage transistors, the relatively thick high voltage gate oxide is removed and a thin gate oxide is formed within step 118.

Step 120 concerns a portion of the EEPROM cell fabrication, and includes an (n−) Fowler-Nordheim tunnel diode implant and the formation of a thin tunnel oxide over the implant. At step 122, a second-level polysilicon (poly 2) layer is deposited, doped, patterned, using masks aligned to the field oxides formed in step 114, and etched to define gates for low- and high-voltage field effect transistors, single-level poly EEPROM cells, and to partially or completely define the control gate for FAMOS n-channel EPROM cells and double-level poly EEPROM cells. At step 124, a patterning and etching of certain double-level poly gate stacks occurs to complete the definition of the FAMOS n-channel EPROM cell control gates and, in one embodiment, stack-etched EEPROM cells.

In step 126, several source/drain implants and diffusions occur. The poly transistor and memory cell gates have sidewall oxides formed adjacent their lateral edges and cap oxides on other exposed polysilicon surfaces prior to the implantation of the source/drains. A lightly doped drain (LDD) (n) type implant is made into the surface source/drain regions of the n-channel field effect transistors immediately before a main (n+) source/drain implantation. The LDD and (n+) implantations are annealed, followed by (p+) source/drain patterning and implantation. The n-type source drain implantation step is further used for surface contact to backgates for p-channel transistors, and the (p+) source/drain implantation step is further used for surface contact to backgates for n-channel transistors.

In step 128, the formation of the semiconductor portions of the fabricated devices is essentially complete and all that is left is the conductive interconnection of these devices with each other and to the outside world, with the exception of Schottky diode devices. A multilevel oxide is deposited in step 128 and is patterned, using the field oxides formed in step 115 for alignment, and etched to produce contact orifices. At step 130, the first level of metal is deposited, patterned (using the contacts formed in step 128 for alignment) and etched, including platinum only for PtSi Schottky diodes, but generally comprising a sputtered titanium tungsten alloy and an aluminum copper alloy on top of these. At step 132, a second-level of insulator is deposited over the first metal and vias are formed. The second metal itself is deposited, patterned and etched at step 134. More vias and another metal layer are optionally formed in steps 135 and 137, respectively. A protective overcoat is added at 136, and various post-clean room processes are performed on the chip at step 138.

Figure 4:
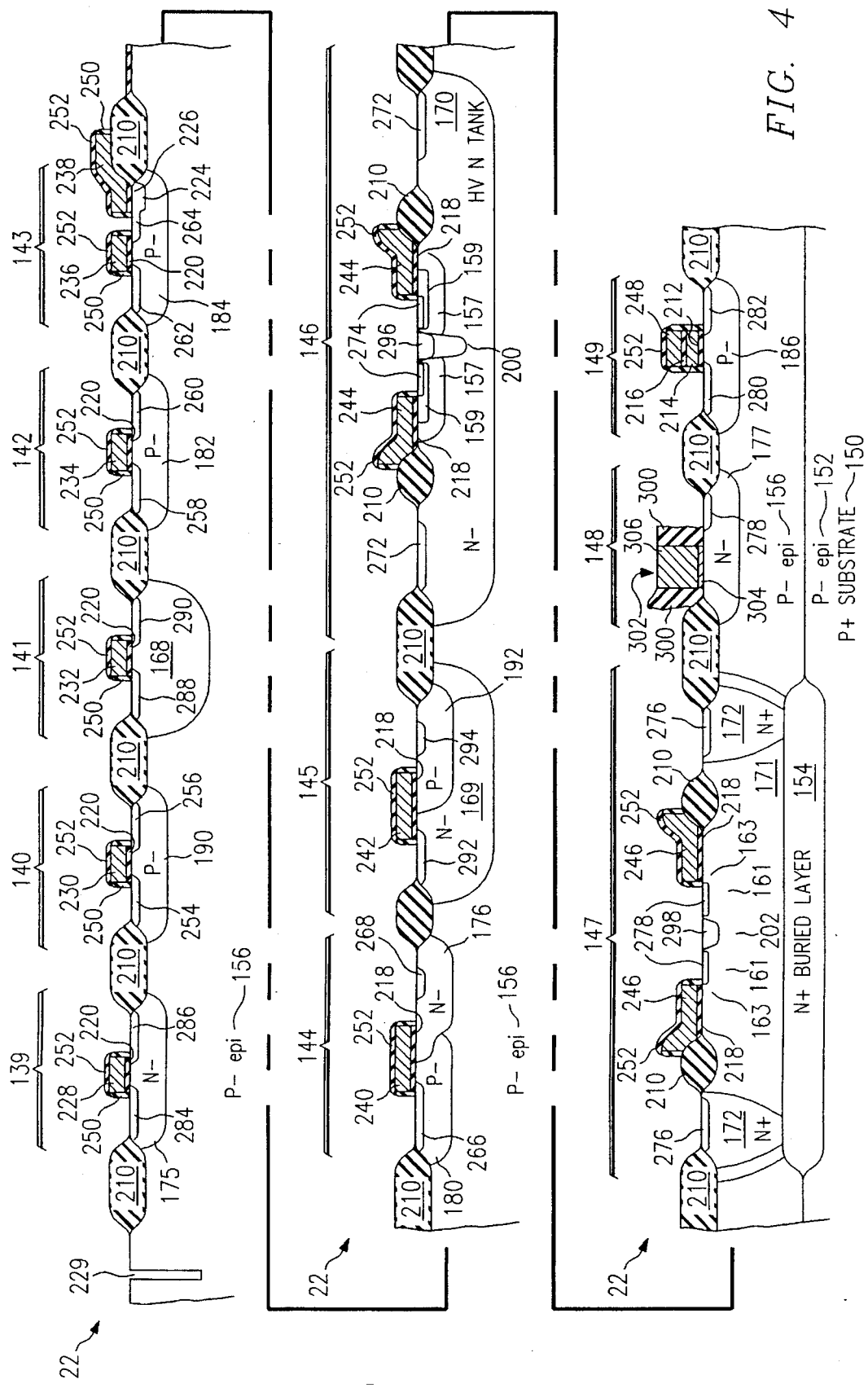
FIG. 4 illustrates a cross-sectional view of several devices fabricated on a semiconductor wafer by the process flow of FIG. 3.

FIG. 4 illustrates a schematic sectional view of various areas of semiconductor chip 22 having different devices formed thereon by using the process described with reference to FIG. 3.

These devices include a low-voltage p-channel field effect transistor 139, a low-voltage logic n-channel field effect transistor 140 (devices 139 and 140 being designed for voltages at or below about five volts), a p-channel isolation or gating field-effect transistor 141 for an EEPROM array, an n-channel isolation or gating field-effect transistor 142 for an EEPROM array, electrically programmable, read-only memory Fowler-Nordheim tunneling cell 143, a drain-extended n-channel field effect transistor 144, a drain-extended p-channel field effect transistor 145, a lateral diffused-source/drain "metal" oxide semiconductor (LDMOS) n-channel field effect transistor 146, a vertical diffused-source/drain "metal" oxide semiconductor (VDMOS) n-channel field effect transistor 147, a Schottky diode 148 and a floating gate avalanche "metal" oxide semiconductor (FAMOS) electrically programmable, read-only memory (EPROM) cell 149. The respective device areas in which these devices are to be made, and the devices themselves, are denoted by the same number throughout these drawings. Devices 141–147 and 149 are designed to be subjected to voltages and/or current densities much greater than the low-voltage logic transistors 139 and 140.

While the various devices formed during this integrated process flow are shown to be adjacent each other, this would not necessarily be the case in the finished semiconductor chip 22. The devices are shown in close association with each other only for the reader's convenience. The reader should understand that certain of the devices can (and most likely will) be separated by wide areas on the actual semiconductor chip 22. However, viewing the various devices in close association gives an understanding of the simultaneous application of each process step to each of the devices fabricated according to the process.

The (n+) buried layer is implanted per step 100 (FIG. 3) using a photoresist pattern (the photoresist pattern is aligned with the global alignment mark(s) 229 fabricated in step 101). The implantation may be done, for example, with an n-type dopant such as antimony, at a dose of about $4 \times 10^{15}$ ions/cm$^2$ and at approximately 40 KeV. The implanted dopant is diffused in a subsequent high temperature step under an inert atmosphere. An epitaxial (p−) layer 156 is grown over the (p−) epitaxial layer 152. The substrate 150 is preferably a p-type silicon that, for example, may have a resistivity of about 0.015 and a [100] crystallography. A (p−) epitaxial layer 152 is grown on top of the silicon substrate 150.

High-voltage (n−)tanks 168, 169, 170, and 171 are formed using the alignment mark(s) 229 for alignment. Portions of tanks 168 and 169 form the channel regions for the p-channel transistors 141 and 145, respectively. Tanks 170 and 171 form portions of the drains for PMOS transistors 146 and 147, respectively.

The (n+) buried layer 154 serves as the drain or source of the vertical DMOS field effect transistor 147. Conductive connection are made to buried layer 154 to connect it to other devices on chip 22 via deep (n+) regions 172. The deep (n+) regions 172 are aligned to the buried (n+) layer via the global alignment mark(s) 229.

N-tank 175 is used as the enclosing tank for the low-voltage p-channel field effect logic transistor 139, N-tank 176 is used as a portion of the drain of a drainextended n-channel power transistor 144, and N-tank 177 is used as the enclosing tank of a Schottky diode 148. One of the technical advantages of the process described herein is that the drain 176 of the drain-extended n-channel field effect transistor 144 is created at the same time as the n-tanks 175 and 177. This simplifies the process, by reducing the number of required masks and mitigates damage to the chip 22 by unnecessary implantation, etching, thermal and cleanup steps. It should be noted that because these tanks are aligned to the global alignment mark(s) and not to previously formed tanks, several process steps are eliminated and device performance is improved.

High-voltage p-tanks are respectively used as an isolating tank for the EEPROM cell 143, as a channel region for the drain-extended n-channel power field effect transistor 144, and as a tank for the FAMOS EPROM cell 149. High-voltage p-tank regions 180, 182, 184 and 186 are formed in devices 144, 142, 143, and 149, respectively. The implantation of high-voltage p-tank 180 changes the p/n diode boundary between it and the low-voltage n-tank 176 as shown.

Low-voltage p-tanks 190 and 192 are used for the low-voltage n-channel field effect transistor 140, and as a drain of the extended-drain p-channel transistor 145.

Deep (p+) diffusions 200 and 202 are used as back gates in lateral DMOS n-channel transistor 146 and vertical DMOS n-channel transistor 147. Each of these tanks are, again, aligned to the global alignment mark(s). The deep (p+) implantations 200 and 202 are preferably centered within the source regions of the DMOS transistors.

EPROM cell 149 contains a floating gate oxide layer 212 atop of the low-voltage p-tank 186. FAMOS floating gate 214 is formed atop oxide layer 212, and a nitride/oxide insulating layer 216 is formed atop floating gate 214. Control gate 248 is formed atop insulating layer 216.

A low-voltage p-channel transistor gate 228, a low-voltage n-channel transistor gate 230, a p-channel EEPROM transistor gate 232, an n-channel EEPROM transistor gate 234, an n-channel EEPROM control gate 236, an EEPROM floating gate 238, a drain-extended n-channel transistor gate 240, a drain-extended p-channel transistor gate 242, an annular or endless lateral DMOS n-channel transistor gate 244, and an annular or endless vertical DMOS n-channel transistor gate 246 are formed in devices 139, 140, 141, 142, 143, 144, 145, 146, and 147, respectively.

Source/drain regions 254 and 256 of device 140, 258 and 260 of device 142, 262 and 264 of device 143, source region 266 for the drain-extended n-channel transistor 144, contact region 268 for the drain of transistor 144, drain contact region 272 and annular source/drain region 274 for the lateral DMOS n-channel transistor 146, deep (n+) contact region 276 and an annular source/drain region 278 for the vertical DMOS transistor 147, contact region 278 for the Schottky diode 148, and source/drain regions 280 and 282 for the FAMOS EPROM cell 149 are formed in step 126 (FIG. 3) and aligned to the moat regions. The (p+) source/drain regions 284, 286, 288 and 290 for the low-voltage and EEPROM gating p-channel field effect transistors 139 and 141, respectively; a source 292 and a drain contact region 294 for the drain extended p-channel transistor 145; and central back gate contact regions 296 and 298 for the lateral DMOS transistor 146 and the vertical DMOS transistor 147, respectively, are also formed in step 126 (FIG. 3) and are aligned to the moat regions.

Platinum is deposited in the Schottky diode orifice(s) 302, as well as all other contact orifices (not shown), and sintered to create a platinum silicide layer 304. A refractory metal such as titanium-tungsten alloy is sputtered in orifice 302 and in the other contact orifices (not shown). The first metal layer is patterned and etched using the alignment mark(s) 229 for alignment. A metal 1 contact is represented by 306; like metal contacts are made to each of the various device terminals of devices 139–149. Some of these contacts are not shown FIG. 4 for the purpose of clarity.

The integrated process described in here is modular, that is, not all of the illustrated devices need to be built for any one particular integrated circuit chip. Where certain of these devices are not required, some of the process steps shown in FIG. 3 are left out. For example, if an integrated circuit does not require EEPROM cells, then the tunnel diode step 120 would be left out. If the particular chip to be fabricated does not require power transistors having buried drain regions or collectors, then the (n+) buried layer step 100, the EPI step 101, and the deep (n+) step 103 would be omitted. If the process does not require FAMOS EPROM cells, the FAMOS floating gate step 115 and the EPROM stack step 124 would be omitted. Certain additions to the integrated process can be made for modifications of the illustrated cells, as will be explained hereafter. A principal technical advantage of the invention is the global alignment mark(s) 229 formed in step 102. The alignment marks eliminate the necessity to form oxide masks as utilized in the prior art, and advantageously eliminate undesirable steps in the n-tank. They also facilitate masking and implanting several regions with dopants of different concentration or conductivity before having to anneal. The design rules for each of these devices can be stored in a library. The integrated circuit designer therefore is able to select different devices from this library with the assurance that an integrated process is available for building them, and that the devices so selected are compatible with this process. This considerably reduces design time for chips having new designs.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What is claimed is:

1. A method of forming a device on a semiconductor substrate of a first conductivity type, said method comprising the steps of:

forming a semiconducting layer on said substrate;

etching alignment marks in said semiconducting layer;

forming a first mask on said semiconducting layer to expose portions of said semiconducting layer;

introducing dopants of a second conductivity type opposite said first conductivity type into said exposed portions of said semiconducting layer to form high-voltage tanks;

removing said first mask;

annealing said dopants introduced to form high-voltage tanks of a second conductivity type;

forming a second mask on said semiconducting layer to expose second portions of said semiconducting layer;

introducing dopants of a second conductivity type into said exposed second portions of said semiconducting layer to form low-voltage tanks;

removing said second mask;

forming a third mask on said semiconducting layer to expose third portions of said semiconducting layer;

introducing dopants of a first conductivity type into said exposed third portions of said semiconducting layer to form high-voltage tanks;

removing said third mask;

forming a fourth mask on said semiconducting layer to expose fourth portions of said semiconducting layer;

introducing dopants of a first conductivity type into said exposed fourth portions of said semiconducting layer to form low-voltage tanks; and annealing dopants introduced to form high-voltage and low-voltage tanks of said first and second conductivity types.

2. A method of simultaneously fabricating a memory cell and a drain extended field effect transistor in a semiconductor material of a first conductivity type, said method comprising:

foxing alignment marks in said semiconductor material;

forming a first tank region of a second conductivity type different from said first conductivity type in said semiconductor material;

simultaneously forming a second tank region and a third tank region of said first conductivity type in said semiconductor material, said second tank region is located in said first tank region and said third tank region is spaced away from said first and second tank regions;

simultaneously forming a first gate structure and a second gate structure insulatively disposed over said semiconductor material, said first gate structure overlies said first tank region and a portion of said second tank region and said second gate structure overlies said third tank region; and wherein said first tank region, said second tank region, said third tank region, said first gate structure and said second gate structure are positioned based on said alignment marks.

3. The method of claim 2, wherein a third gate structure is simultaneously formed with said first and second gate structures and aligned using said alignment marks, a portion of said third gate structure is insulatively disposed over said third tank region and the remainder of said third gate structure is disposed over a field insulating region.

4. The method of claim 2 further comprising the step of fabricating a third gate structure which is insulatively disposed over said third tank region and situated between said semiconductor material and said second gate structure.

\* \* \* \* \*

UNITED STATES PATENT AND TRADEMARK OFFICE
CERTIFICATE OF CORRECTION

PATENT NO. : 5,500,392
DATED : MARCH 19, 1996
INVENTOR(S) : JACK REYNOLDS, MICHAEL C. SMAYLING

It is certified that error appears in the above-indentified patent and that said Letters Patent is hereby corrected as shown below:

Title page, item [75], inventor: Change "James" to --Jack--.

Signed and Sealed this

Third Day of June, 1997

Attest:

BRUCE LEHMAN

Attesting Officer    Commissioner of Patents and Trademarks